(12) United States Patent
Kasem et al.

(10) Patent No.: US 6,249,041 B1
(45) Date of Patent: Jun. 19, 2001

(54) IC CHIP PACKAGE WITH DIRECTLY CONNECTED LEADS

(75) Inventors: Y. Mohammed Kasem, Santa Clara; Anthony C. Tsui, Saratoga; Lixiong Luo, San Jose; Yueh-Se Ho, Sunnyvale, all of CA (US)

(73) Assignee: Siliconix Incorporated, Santa Clara, CA (US)

( * ) Notice: Subject to any disclaimer, the term of this patent is extended or adjusted under 35 U.S.C. 154(b) by 0 days.

(21) Appl. No.: 09/089,310

(22) Filed: Jun. 2, 1998

(51) Int. Cl.$^7$ ................................................ H01L 23/495
(52) U.S. Cl. ........................................... 257/666; 257/692
(58) Field of Search ................................... 257/666, 735, 257/341, 692

(56) References Cited

U.S. PATENT DOCUMENTS

| | | | |
|---|---|---|---|
| 4,935,803 | 6/1990 | Kalfus et al. | 357/68 |
| 5,365,106 | 11/1994 | Watanabe | 257/669 |
| 5,544,412 | 8/1996 | Romero et al. | 29/832 |
| 5,665,996 | 9/1997 | Williams et al. | 257/401 |
| 5,821,611 | * 10/1998 | Kuboto et al. | 257/673 |
| 6,040,626 | 3/2000 | Cheah et al. | 257/735 |

\* cited by examiner

*Primary Examiner*—Roy Potter
(74) *Attorney, Agent, or Firm*—Skjerven Morrill MacPherson LLP; David E. Steuber

(57) ABSTRACT

An improved semiconductor device is disclosed. In one embodiment, the semiconductor device includes a semiconductor chip with contact areas on the top or bottom surface. A first lead assembly, formed from a semi-rigid sheet of conductive material, has a lead assembly contact attached to one of the contact areas of the semiconductor chip. The first lead assembly also has at least one lead connected to and extending from the lead assembly contact. A second lead assembly, also formed from a semi-rigid sheet of conductive material, has a lead assembly contact attached to another one of the contact areas of the semiconductor chip. The second lead assembly also has at least one lead connected to and extending from the lead assembly contact. An encapsulant encloses the semiconductor chip, the lead assembly contact of the first lead assembly and the lead assembly contact of the second lead assembly. The semiconductor device has low electrical and thermal resistance contributions from the package due to the direct connection of the lead assemblies to the chip. The semiconductor device may be formed as either a leaded package or a leadless chip carrier package.

13 Claims, 8 Drawing Sheets

IC CHIP PACKAGE WITH DIRECTLY CONNECTED LEADS

TECHNICAL FIELD OF THE INVENTION

The present invention relates to semiconductor devices, and in particular to an integrated circuit (IC) chip package with directly connected leads.

BACKGROUND OF THE INVENTION

In the field of power semiconductors, and in particular in the field of power MOSFETs, the performance of a product is determined by the ability of the product to act as an ideal switch for a high current. Performance therefore depends on the ability of the product to provide a near-infinite resistance in the off state and a near-zero resistance in the on state.

Recent advances in power MOSFET technology have significantly reduced the on-state resistance of the semiconductor components of power MOSFET devices, making the contact metallization resistance and package resistance a significant part of the device on-state resistance. Thus, to achieve further significant reductions in on-state resistance, the metallization and package resistance must be reduced.

In addition, the resistance in a power MOSFET device generates heat which must be removed to maintain high performance. Cooling of power MOSFET devices is fundamentally limited by current device configurations. Even in vertical power MOSFET devices, a majority of the heat generated in a power MOSFET device is generated in the top 10 microns of the semiconductor die. Because thermally conductive packaging such as ceramic packaging is expensive, a thermally insulative packaging material such as plastic is typically used. Thus, to reach a cooling surface, the heat generated near the top surface of the die must either travel through the bond wires and leads, which can conduct only a limited amount of heat, or through the semiconductor to the back side of the die. Since the thermal conductivity of silicon cannot be significantly changed, significant advances in heat removal require a device configuration that allows better thermal transport from the top side of the die.

SUMMARY OF THE INVENTION

Therefore, a need has arisen for a semiconductor device that addresses the disadvantages and deficiencies of the prior art. In particular, a need has arisen for a semiconductor device with reduced electrical and thermal resistance contributions from the package.

Accordingly, an improved semiconductor device is disclosed. In one embodiment, the semiconductor device includes a semiconductor chip with a plurality of contact areas on either the top or bottom surface. A first lead assembly, formed from a semi-rigid sheet of conductive material, has a lead assembly contact attached to one of the contact areas of the semiconductor chip. The first lead assembly has at least one lead connected to and extending from the lead assembly contact. A second lead assembly, also formed from a semi-rigid sheet of conductive material, has a lead assembly contact attached to another one of the contact areas of the semiconductor chip. The second lead assembly has at least one lead connected to and extending from the lead assembly contact. An encapsulant encloses the semiconductor chip, the lead assembly contact of the first lead assembly and the lead assembly contact of the second lead assembly.

A technical advantage of the present invention is that the semiconductor device has low electrical and thermal resistance contributions from the package. Another technical advantage of the present invention is that lead frames with chip contact areas smaller than the chip itself are used, thereby allowing a smaller package size and more efficient utilization of the limited surface area available on a printed circuit board. Yet another technical advantage is that the semiconductor device may be formed as either a leaded package or a leadless chip carrier package.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

The preferred embodiments of the present invention and their advantages are best understood by referring to FIGS. 1A through 8B of the drawings. Like numerals are used for like and corresponding parts of the various drawings.

Figure 1A:
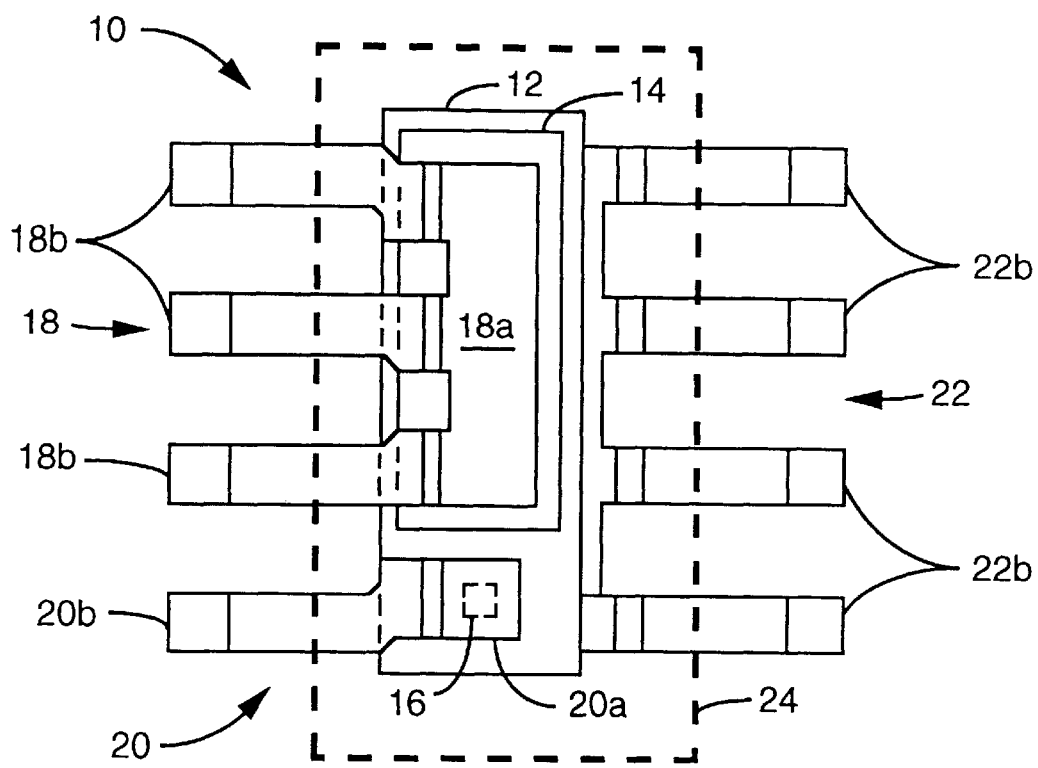
FIG. 1A is a top view of a first power MOSFET package constructed in accordance with one embodiment of the present invention.
Figure 1B:
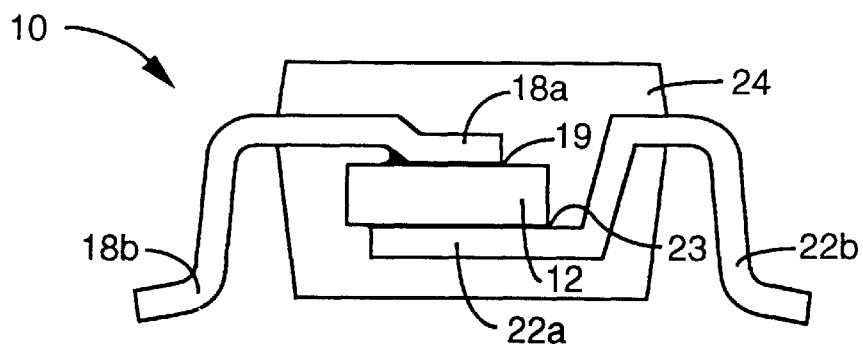
FIG. 1B is a cross section of the first power MOSFET package.

Referring to FIGS. 1A and 1B, a power MOSFET package 10 constructed in accordance with the present invention is shown in top view and cross section, respectively. In power MOSFET package 10, a power MOSFET chip or die 12 has an array of vertical MOSFETs (not explicitly shown) powered by common contact areas. Power MOSFET chip 12 may be, for example, fabricated in accordance with U.S. Pat. No. 5,665,996, entitled "Vertical Power MOSFET Having Thick Metal Layer to Reduce Distributed Resistance," issued to Richard K. Williams and Mohammad Kasem on Sep. 9, 1997, which is incorporated herein by reference. Chip 12 may alternatively be any semiconductor integrated circuit chip.

A source contact area 14 and a gate contact area 16 on the top side of chip 12 are each covered with a metallization layer formed from a conductive metal such as aluminum, nickel or copper. Likewise, a drain contact area (not shown) on the bottom side of the chip is covered with a metallization layer.

A source lead assembly 18 has a contact area 18*a* in contact with the source contact area 14 on chip 12. Contact area 18*a* on source lead assembly 18 is held in contact with source contact area 14 on chip 12 by an electrically conductive adhesive layer 19. Three source leads 18*b* extend from contact area 18*a* to provide electrical contact with a printed circuit board.

Lead assembly 18 is formed from a sheet of metal such as copper alloy with a thickness of, for example, 250 microns (approximately 0.01 inches). Lead assembly 18, like other lead assemblies described herein, preferably has a thickness of 5–50 mils. Other electrically conductive metals such as aluminum may also be used for source lead assembly 18.

Contact area 18*a* on source lead assembly 18 maintains electrical contact with a large portion of source contact area 14. Since contact area 18*a* is thicker than the metallization layer that forms source contact area 14, contact area 18*a* provides less distributed resistance than source contact area 14. Contact area 18*a* may therefore eliminate or decrease the voltage drop across the face of source contact area 14 that might otherwise arise if a small area contact, such as a conventional bond wire contact, were used to electrically contact a portion of source contact area 14. Source leads 18*b* also provide lower electrical resistance than conventional bond wires, thereby significantly reducing the package resistance of power MOSFET package 10.

Like source lead assembly 18, a gate lead assembly 20 has a contact area 20*a* in contact with gate contact area 16 on chip 12. Contact area 20*a* on gate lead assembly 20 is held in contact with gate contact area 16 on chip 12 by electrically conductive adhesive layer 19. The portion of adhesive layer 19 which secures gate lead assembly 20 to gate contact area 16 is, of course, separate from (not in contact with) the portion of adhesive layer 19 that secures source lead assembly 18 to source contact area 14 on chip 12. One gate lead 20*b* extends from contact area 20*a* to provide electrical contact with the printed circuit board.

Similarly, a drain lead assembly 22 has a contact area 22*a* in contact with the drain contact area on the bottom side of chip 12 and four drain leads 22*b* extending from contact area 22*a* to provide electrical contact with the printed circuit board. Contact area 22*a* on drain lead assembly 22 is held in contact with the drain contact area on chip 12 by an electrically conductive adhesive layer 23.

A plastic encapsulant 24 encapsulates chip 12, contact areas 18*a*, 20*a* and 22*a* of lead assemblies 18, 20 and 22, and portions of leads 18*b*, 20*b* and 22*b*. Encapsulant 24 provides electrical and thermal insulation of chip 12 from the outside world, as well as giving structural support and rigidity to power MOSFET package 10. Encapsulant 24 may be any known encapsulant such as an epoxy Novolac-based molding compound.

To illustrate the fabrication of power MOSFET package 10, FIGS. 2A through 2D show cross sections of power MOSFET package 10 at various stages of fabrication. First, power MOSFET chip 12 is patterned and cut from a semiconductor wafer. A first lead frame strip 26 is stamped from a semi-rigid, 250-micron-thick sheet of copper alloy or other metal. Lead frame strip 26 includes source lead assembly 18 and gate lead assembly 20. Lead frame strip 26 also includes a connecting portion (not explicitly shown) that holds source lead assembly 18 and gate lead assembly 20 together and provides structural support for lead frame strip 26. The connecting portion of lead frame strip 26 may also connect source lead assembly 18 and gate lead assembly 20 to source and gate lead assemblies for several other power MOSFET packages (not shown) which may be fabricated simultaneously with power MOSFET package 10.

Figure 2A:
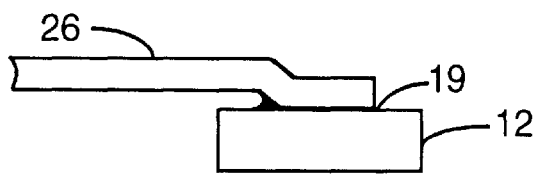
FIGS. 2A through 2D are cross sections of the first power MOSFET package at various stages of fabrication.

Referring to FIG. 2A, an electrically conductive adhesive 19 is deposited on source contact area 14 and, separately, on gate contact area 16 of power MOSFET chip 12. Adhesive layer 19 and other adhesive layers described herein may be, for example, a silver-filled epoxy or polyimide paste. Alternatively, adhesive layer 19 may comprise a series of solder bumps or other electrically conductive, adhesive material. Lead frame strip 26 is then pressed onto the top surface of chip 12, with contact areas 18*a* and 20*a* on lead frame strip 26 aligned with source and gate contact areas 14 and 16, respectively.

Figure 2B:
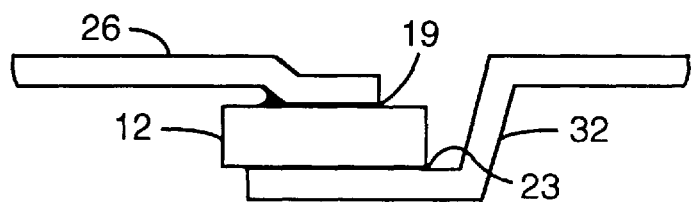

Referring to FIG. 2B, chip 12 is inverted and a second adhesive layer 23 is deposited on the drain contact area on the bottom side of chip 12. A second pre-formed lead frame strip 32 includes drain lead assembly 22 and a connecting portion (not shown) which may connect drain lead assembly 22 with drain lead assemblies of several other power MOSFET packages. Contact area 22*a* of lead frame strip 32 is pressed against the drain contact area on chip 12. Lead frame strip 32 is shaped such that drain leads 22*b* are initially approximately coplanar with source and gate leads 18*b* and 20*b* of lead frame strip 26. Chip 12 is then inverted once again to the upright position shown in FIG. 2B. Adhesive layers 19 and 23 are then cured in a curing oven, if necessary.

An alternative to the die attach step described in the previous paragraph is to deposit the second adhesive layer 23 on contact area 22*a* of lead frame strip 92, rather than on the drain contact area on the bottom side of chip 12. Chip 12 is then pressed against lead frame strip 32, with contact area 22*a* of lead frame strip 32 aligned with the drain contact area on chip 12. Adhesive layers 19 and 23 may then be cured in a curing oven as previously described. This alternative die attach step eliminates the need to invert chip 12 prior to die attach.

Prior to the curing of adhesive layers 19 and 23, in order to maintain the relative positions of lead frame strips 26 and 32, the lead frame strips are preferably attached to each other in a mechanically rigid manner such as welding, clamping or soldering. This attachment prevents lead assemblies 18, 20 and 22 from contacting each other and creating a short circuit from source to drain or from gate to drain. The attachment means may be removed at any time after adhesive layers 19 and 23 are cured, preferably before or during the trim-and-form step described below.

Figure 2C:
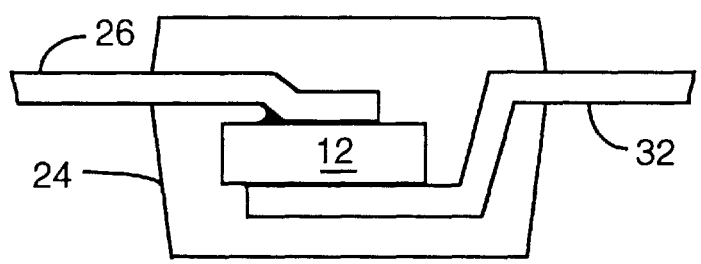
Figure 2D:
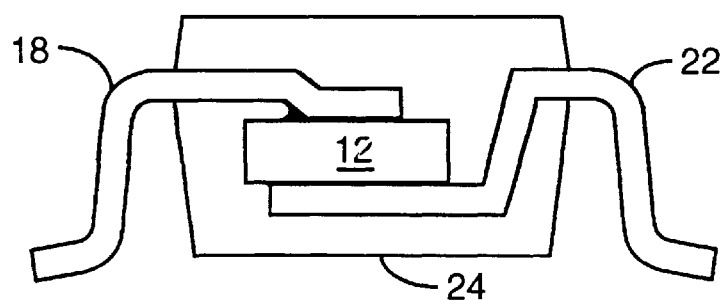

Referring to FIG. 2C, chip 12 is placed in a mold and plastic encapsulant 24 is injection-molded around chip 12 and portions of lead frame strips 26 and 32. Referring to FIG. 2D, lead frame strip 26 is trimmed to remove the connecting portions of the lead frame strip, thereby separating source leads 18*b* from gate lead 20*b*, and separating source and gate leads 18*b* and 20*b* from the source and gate leads of any other power MOSFET packages connected by lead frame strip 26. Likewise, lead frame strip 32 is trimmed to remove the connecting portion of the lead frame strip.

Source, gate and drain leads 18*b*, 20*b* and 22*b* are also formed in a gull-wing shape for surface-mounting on a printed circuit board. The above-mentioned trim and form steps are preferably performed simultaneously by a single press which can accommodate the number of chips connected by lead frame strips 26 and 32.

After fabrication, power MOSFET package 10 may be mounted on a printed circuit board, with source, gate and drain leads 18b, 20b and 22b aligned with corresponding contact areas on the printed circuit board. A standard solder reflow process may be used to provide rigid structural and electrical contact between power MOSFET package 10 and the printed circuit board.

As previously stated, the source, gate and drain leads 18b, 20b and 22b of power MOSFET package 10 provide low electrical resistance between the printed circuit board and power MOSFET chip 12. Leads 18b and 20b and also provide low thermal resistance between the printed circuit board and the top side of power MOSFET chip 12, unlike conventional wire bonds. Leads 18b and 20b may therefore be cooled to provide cooling power to the top side of power MOSFET chip 12, where a majority of the heat is generated in power MOSFET package 10.

Figure 3A:
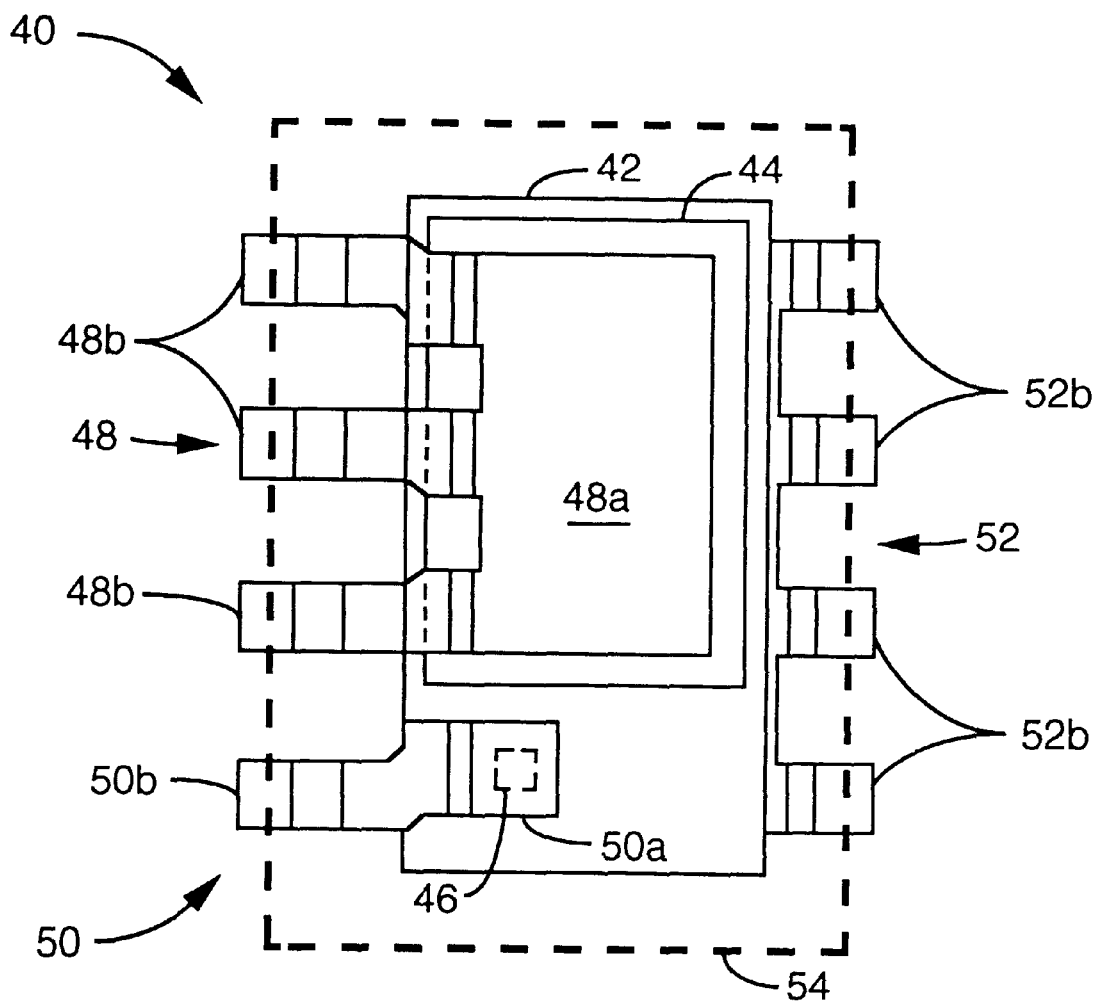
FIG. 3A is a top view of a second power MOSFET package constructed in accordance with one embodiment of the present invention.
Figure 3B:
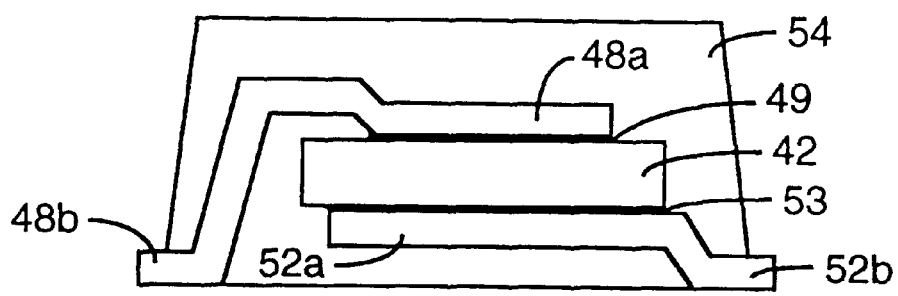
FIG. 3B is a cross section of the second power MOSFET package.

Referring to FIGS. 3A and 3B, a second power MOSFET package 40 constructed in accordance with the present invention is shown in top view and cross section, respectively. Power MOSFET package 40, like power MOSFET package 10, has a power MOSFET chip 42 powered by common contact areas. A source contact area 44 and a gate contact area 46 on the top side of chip 42 are each covered with a metallization layer formed from a conductive metal such as aluminum, nickel or copper. Likewise, a drain contact area (not shown) on the bottom side of chip 42 is covered with a metallization layer.

A source lead assembly 48 has a contact area 48a in contact with the source contact area 44 on chip 42. Contact area 48a on source lead assembly 48 is held in contact with source contact area 44 on chip 42 by an electrically conductive adhesive layer 49. Three source leads 48b extend from contact area 48a to provide electrical contact with a printed circuit board.

Contact area 48a on source lead assembly 48 maintains electrical contact with a large portion of source contact area 44. Contact area 48a and source leads 48b are formed from a sheet of metal such as copper alloy with a thickness of, for example, 250 microns (approximately 0.01 inches). Other electrically conductive metals such as aluminum may also be used for source lead assembly 48.

Since contact area 48a is thicker than the metallization layer that forms source contact area 44, contact area 48a provides less distributed resistance than source contact area 44. Contact area 48a may therefore eliminate or decrease the voltage drop across the face of source contact area 44 that might otherwise arise if a small area contact, such as a conventional bond wire contact, were used to electrically contact a portion of source contact area 44. Source leads 48b also provide lower electrical resistance than conventional bond wires, thereby significantly reducing the package resistance of power MOSFET package 40.

Like source lead assembly 48, a gate lead assembly 50 has a contact area 50a in contact with gate contact area 46 on chip 42. Contact area 50a on gate lead assembly 50 is held in contact with gate contact area 46 on chip 42 by an electrically conductive adhesive layer (not shown). One gate lead 50b extends from contact area 50a to provide electrical contact with the printed circuit board. Similarly, a drain lead assembly 52 has a contact area 52a in contact with the drain contact area on the bottom side of chip 42 and four drain leads 52b extending from contact area 52a to provide electrical contact with the printed circuit board. Contact area 52a on drain lead assembly 52 is held in contact with the drain contact area on chip 42 by an electrically conductive adhesive layer 53.

A plastic encapsulant 54 encapsulates chip 42, contact areas 48a, 50a and 52a of lead assemblies 48, 50 and 52, and portions of leads 48b, 50b and 52b of lead assemblies 48, 50 and 52. Encapsulant 54 provides electrical and thermal insulation of chip 42 from the outside world, as well as giving structural support and rigidity to power MOSFET package 40. Encapsulant 54 may be any known plastic encapsulant such as an epoxy Novolac-based molding compound. Encapsulant 54 encapsulates a large portion of leads 48b, 50b and 52b, forming a leadless chip carrier type of package.

Unlike power MOSFET package 10, power MOSFET package 40 has an encapsulant 54 which almost entirely encloses the leads 48b, 50b and 52b. Power MOSFET package 40 therefore has a bottom encapsulant surface 54a which is flush with the surface mount contact areas of leads 48b, 50b and 52b.

The fabrication of power MOSFET package 40 is similar to the fabrication of power MOSFET package 10, and therefore will not be described in detail. One difference between the two fabrication processes is that lead assemblies 48, 50 and 52 of power MOSFET package 40 are pre-formed into a gull-wing shape prior to attachment to chip 42. Thus, the trim-and-form step described above for power MOSFET package 10 need only remove excess material and connecting portions from the respective lead frame strips of power MOSFET package 40, without shaping leads 48b, 50b and 52b. Furthermore, the encapsulation step for power MOSFET package 40 must be performed such that bottom encapsulant surface is formed flush with the surface mount contact areas on leads 48b, 50b and 52b, while leaving the surface mount contact areas exposed for later attachment to a printed circuit board.

Figure 4A:
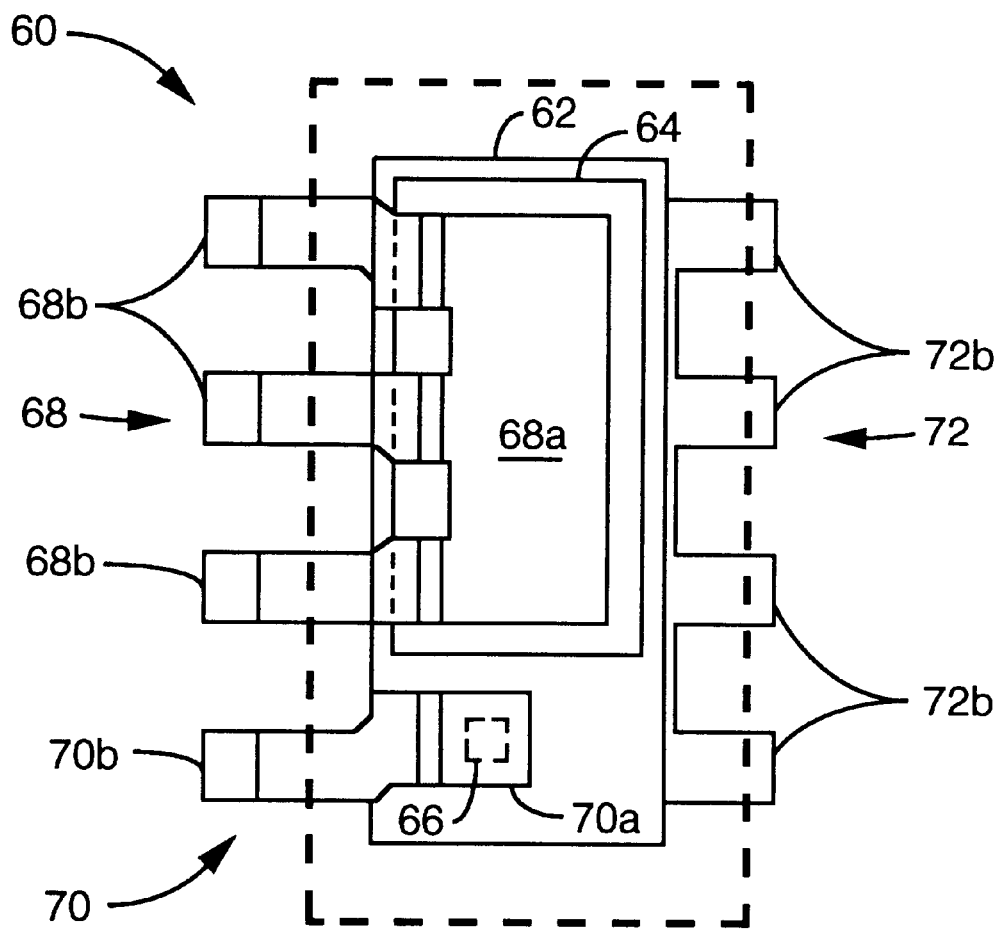
FIG. 4A is a top view of a third power MOSFET package constructed in accordance with one embodiment of the present invention.
Figure 4B:
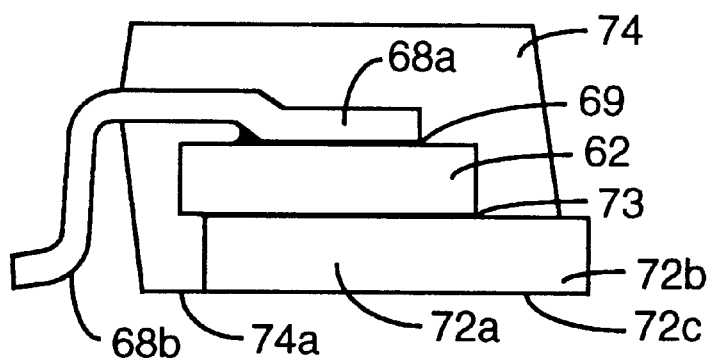
FIG. 4B is a cross section of the third power MOSFET package.

Referring to FIGS. 4A and 4B, a third power MOSFET package 60 constructed in accordance with the present invention is shown in top view and cross section, respectively. Power MOSFET package 60, like power MOSFET packages 10 and 40, has a power MOSFET chip 62 powered by common contact areas. A source contact area 64 and a gate contact area 66 on the top side of chip 62 are each covered with a metallization layer formed from a conductive metal such as aluminum, nickel or copper, likewise, a drain contact area (not shown) on the bottom side of chip 62 is covered with a metallization layer.

A source lead assembly 68 has a contact area 68a in contact with the source contact area 64 on chip 62. Contact area 68a on source lead assembly 68 is held in contact with source contact area 64 on chip 62 by an electrically conductive adhesive layer 69. Three source leads 68b extend from contact area 68a to provide electrical contact with a printed circuit board.

Contact area 68a on source lead assembly 68 maintains electrical contact with a large portion of source contact area 64. Contact area 68a and source leads 68b are formed from a sheet of metal such as copper alloy with a thickness of, for example, 250 microns (approximately 0.01 inches). Other electrically conductive metals such as aluminum may also be used for source lead assembly 68.

Since contact area 68a is thicker than the metallization layer that forms source contact area 64, contact area 68a provides less distributed resistance than source contact area 64. Contact area 68a may therefore eliminate or decrease the voltage drop across the face of source contact area 64 that might otherwise arise if a small area contact, such as a conventional bond wire contact, were used to electrically contact a portion of source contact area 64. Source leads 68*b* also provide lower electrical resistance than conventional bond wires, thereby significantly reducing the package resistance of power MOSFET package 60.

Like source lead assembly 68, a gate lead assembly 70 has a contact area 70*a* in contact with gate contact area 66 on chip 62. Contact area 70*a* on gate lead assembly 70 is held in contact with gate contact area 66 on chip 62 by an electrically conductive adhesive layer (not shown). One gate lead 70*b* extends from contact area 70*a* to provide electrical contact with the printed circuit board. Similarly, a drain lead assembly 72 has a contact area 72*a* in contact with the drain contact area on the bottom side of chip 62 and four drain leads 72*b* extending from contact area 72*a* to provide electrical contact with the printed circuit board. Contact area 72*a* on drain lead assembly 72 is held in contact with the drain contact area on chip 62 by an electrically conductive adhesive layer 73.

A plastic encapsulant 74 encapsulates chip 62, contact areas 68*a*, 70*a* and 72*a* of lead assemblies 68, 70 and 72, and portions of leads 68*b*, 70*b* and 72*b* of lead assemblies 68, 70 and 72. Encapsulant 74 provides electrical and thermal insulation of chip 62 from the outside world, as well as giving structural support and rigidity to power MOSFET package 60. Encapsulant 74 may be any known plastic encapsulant such as an epoxy Novolac-based molding compound.

Unlike power MOSFET packages 10 and 40, power MOSFET package 60 has a drain lead assembly 72 with a bottom surface 72*c* which is flush with the bottom encapsulant surface 74*a*. The entire bottom surface 72*c* of drain lead assembly 72 is exposed, providing a large electrical and thermal contact area for attachment to the printed circuit board.

The fabrication of power MOSFET package 60 is illustrated in FIGS. 5A through 5D. First, a lead frame strip 76 is stamped from a semi-rigid, 250-micron-thick sheet of copper alloy or other metal. Lead frame strip 76 includes source lead assembly 68 and gate lead assembly 70. Lead frame strip 76 also includes a connecting portion (not explicitly shown) that holds source lead assembly 68 and gate lead assembly 70 together and provides structural support for lead frame strip 76. The connecting portion of lead frame strip 76 may also connect source lead assembly 68 and gate lead assembly 70 to source and gate lead assemblies for several other power MOSFET packages (not shown) which may be fabricated simultaneously with power MOSFET package 10.

Figure 5A:
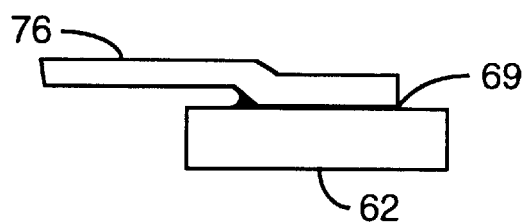
FIGS. 5A through 5D are cross sections of the third power MOSFET package at various stages of fabrication.

Referring to FIG. 5A, an electrically conductive adhesive layer 69 is deposited on source contact area 64 and, separately, on gate contact area 66 of power MOSFET chip 62. Adhesive layer 69 may be, for example, a silver-filled epoxy or polyimide paste. Lead frame strip 76 is then pressed onto the top surface of chip 62, with contact areas 68*a* and 70*a* on lead frame strip 76 aligned with source and gate contact areas 64 and 66, respectively.

Figure 5B:
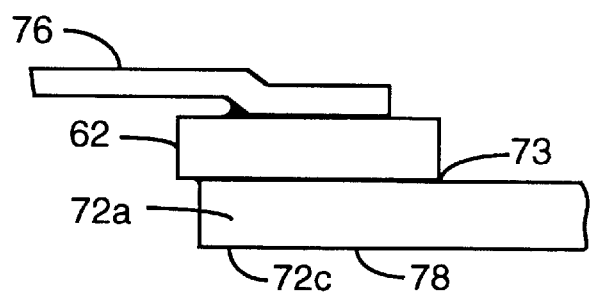

Referring to FIG. 5B, chip 62 is inverted and a second adhesive layer 73 is deposited on the drain contact area on the bottom side of chip 62. A second pre-formed lead frame strip 78 includes drain lead assembly 72 and a connecting portion (not shown) which may connect drain lead assembly 72 with drain lead assemblies of several other power MOSFET packages. Drain lead assembly 72 is shaped such that the bottom surface 72*c* of contact area 72*a* and drain leads 72*b* is flat. Contact area 72*a* of lead frame strip 78 is pressed against the drain contact area on chip 62. Chip 62 is then inverted once again to the upright position shown in FIG. 5B. Adhesive layers 69 and 73 are then cured in a curing oven, if necessary.

An alternative to the die attach step described in the previous paragraph is to deposit the second adhesive layer 73 on contact area 72*a* of lead frame strip 78, rather than on the drain contact area on the bottom side of chip 62. Chip 62 is then pressed against lead frame strip 78, with contact area 72*a* of lead frame strip 78 aligned with the drain contact area on chip 62. Adhesive layers 69 and 73 may then be cured in a curing oven as previously described. This alternative die attach step eliminates the need to invert chip 62 prior to attachment of lead frame strip 78.

Prior to the curing of adhesive layers 69 and 73, in order to maintain the relative positions of lead frame strips 76 and 78, the lead frame strips are preferably attached to each other in a mechanically rigid manner such as clamping, welding or soldering. This attachment prevents lead assemblies 68, 70 and 72 from contacting each other and creating a short circuit from source to drain or from gate to drain. The attachment means may be removed at any time after adhesive layers 69 and 73 are cured, preferably before or during the trim-and-form step described below.

Figure 5C:
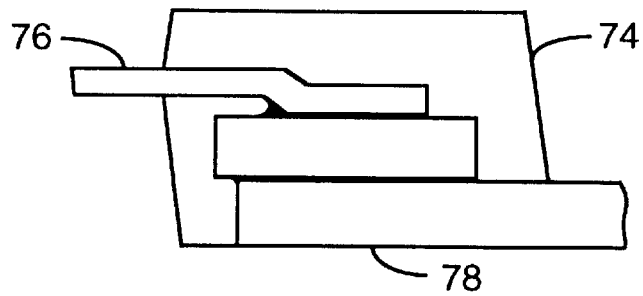

Referring to FIG. 5C, chip 62 is placed in a mold and plastic encapsulant 74 is injection-molded around chip 62 and portions of lead frame strips 76 and 78. The entire bottom surface of drain lead assembly 72 is left exposed for mounting on a printed circuit board.

Figure 5D:
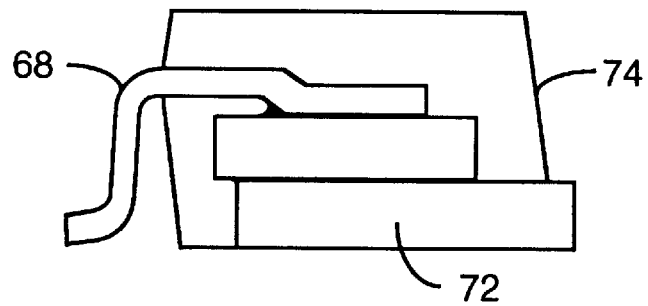

Referring to FIG. 5D, lead frame strip 76 is trimmed to remove the connecting portions of the lead frame strip, thereby separating source leads 68*b* from gate lead 70*b*, and separating source and gate leads 68*b* and 70*b* from the source and gate leads of any other power MOSFET packages connected by lead frame strip 76. Likewise, lead frame strip 78 is trimmed to remove the connecting portion of the lead frame strip.

Source and gate leads 68*b* and 70*b* are also formed in a gull-wing shape for surface-mounting on a printed circuit board. The extremities of leads 68*b* and 70*b* are formed to be coplanar with drain lead assembly 72. The above-mentioned trim and form steps are preferably performed simultaneously by a single press which can accommodate the number of chips connected by lead frame strips 76 and 78.

After fabrication, power MOSFET package 60 may be mounted on a printed circuit board, with source and gate leads 68*b* and 70*b* and drain lead assembly 72 aligned with corresponding contact areas on the printed circuit board. A standard solder reflow process may be used to provide rigid structural and electrical contact between power MOSFET package 60 and the printed circuit board.

Figure 6A:
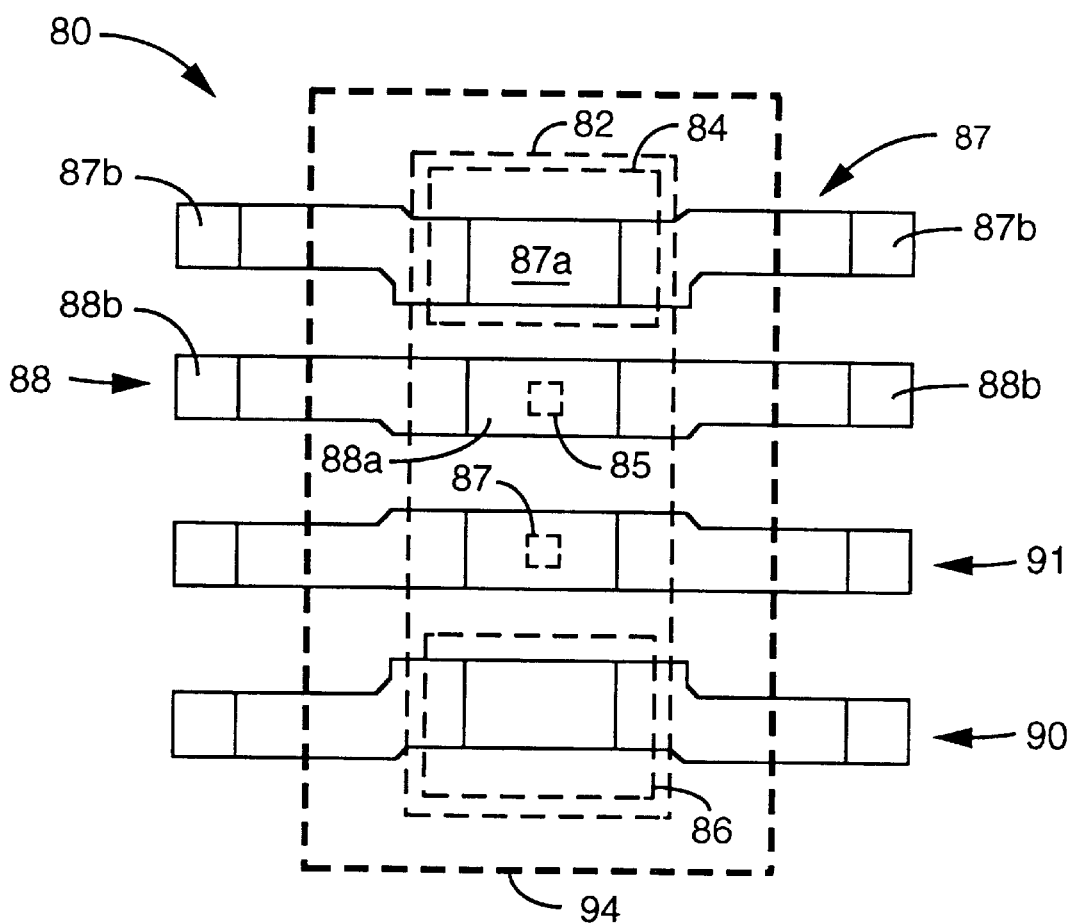
FIG. 6A is a top view of a fourth power MOSFET package constructed in accordance with one embodiment of the present invention.
Figure 6B:
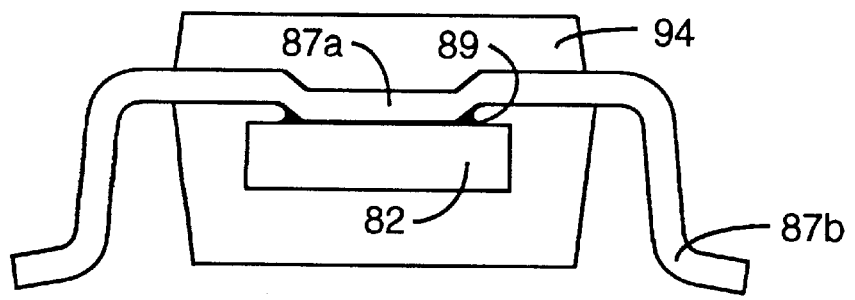
FIG. 6B is a cross section of the fourth power MOSFET package.

Referring to FIGS. 6A and 6B, a fourth power MOSFET package 80 constructed in accordance with the present invention is shown in top view and cross section, respectively. Power MOSFET package 80, like power MOSFET packages 10, 40 and 60, has a power MOSFET chip 82 powered by common contact areas.

However, power MOSFET chip 82 is different from the power MOSFET chips previously described because not all of the MOSFETs on power MOSFET chip 82 are connected in parallel. Instead, the MOSFETs on power MOSFET chip 82 are divided into two groups. The first group of MOSFETs has a metallized common source contact area 84 and a metallized common gate contact area 85 on the top side of chip 82. The first group of MOSFETs also has a common drain (not shown), which may for example be implemented as a metallization layer on the bottom side of chip 12. Each of the aforementioned metallization layers is formed from a conductive metal such as aluminum, nickel or copper.

The second group of MOSFETs has a metallized common source contact area 86 and a metallized common gate contact area 87 on the top side of chip 82. The second group of MOSFETs also has a common drain (not shown) which is shared with the first group of MOSFETs. Thus, the two groups of MOSFETs effectively form two power MOSFET devices connected in series via a common drain connection. The two MOSFET devices are individually controlled by two separate gates.

A first source lead assembly 87 has a contact area 87a in contact with the first source contact area 84 on chip 82. Contact area 87a on source lead assembly 87 is held in contact with source contact area 84 on chip 82 by an electrically conductive adhesive layer 89. Two source leads 87b extend from contact area 87a on each side of chip 82 to provide electrical contact with a printed circuit board.

Contact area 87a on source lead assembly 87 maintains electrical contact with a large portion of source contact area 84. Contact area 87a and source leads 87b are formed from a sheet of metal such as copper alloy with a thickness of, for example, 250 microns (approximately 0.01 inches). Other electrically conductive metals such as aluminum may also be used for source lead assembly 87.

Since contact area 87a is thicker than the metallization layer that forms source contact area 84, contact area 87a provides less distributed resistance than source contact area 84. Contact area 87a may therefore eliminate or decrease the voltage drop across the face of source contact area 84 that might otherwise arise if a small area contact, such as a conventional bond wire contact, were used to electrically contact a portion of source contact area 84. Source leads 87b also provide lower electrical resistance than conventional bond wires, thereby significantly reducing the package resistance of power MOSFET package 80.

Like source lead assembly 87, a gate lead assembly 88 has a contact area 88a in contact with gate contact area 86 on chip 82. Contact area 88a on gate lead assembly 88 is held in contact with gate contact area 86 on chip 82 by an electrically conductive adhesive layer (not shown). Two gate leads 88b extend from contact area 88a on each side of chip 82 to provide electrical contact with the printed circuit board.

Similarly, source lead assembly 90 and gate lead assembly 91 are connected to source and gate contact areas 86 and 87, respectively. Each lead assembly has leads extending to either side of chip 82.

A plastic encapsulant 94 encapsulates chip 82 and portions of lead assemblies 87, 88, 90 and 91. Encapsulant 94 provides electrical and thermal insulation of chip 82 from the outside world, as well as giving structural support and rigidity to power MOSFET package 80. Encapsulant 94 may be any known plastic encapsulant such as an epoxy Novolac-based molding compound.

Figure 7A:
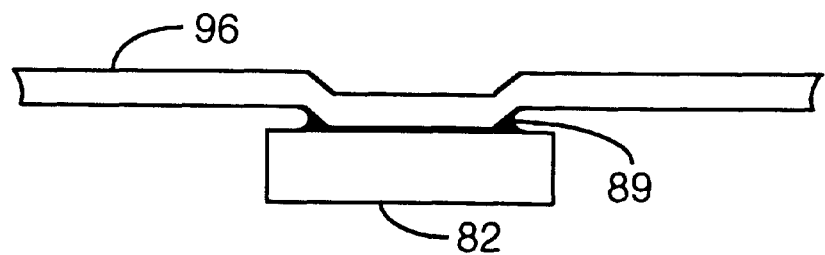
FIGS. 7A through 7C are cross sections of the fourth power MOSFET package at various stages of fabrication.
Figure 7B:
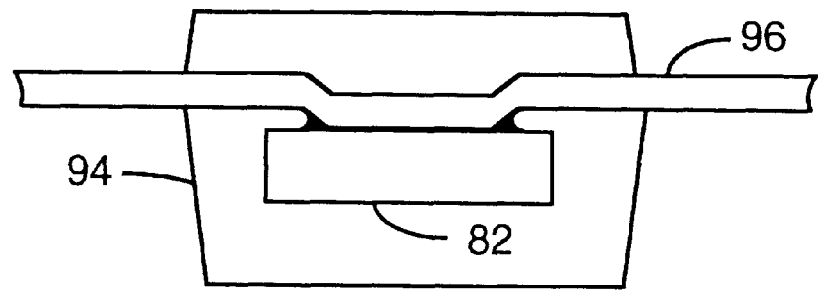
Figure 7C:
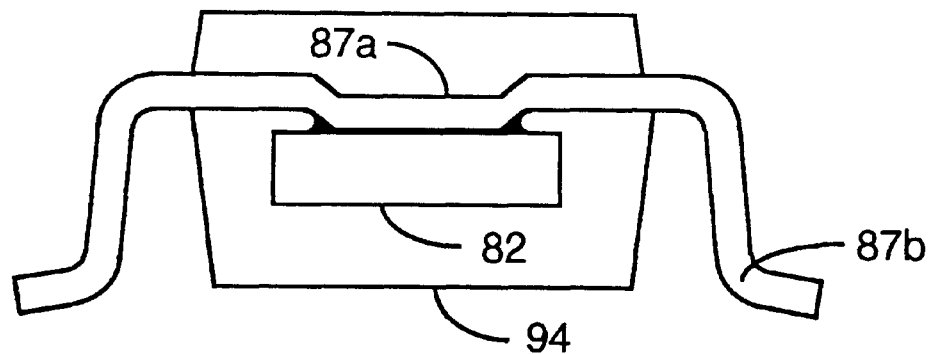

The fabrication of power MOSFET package 80 is illustrated in FIGS. 7A through 7C. First, a lead frame strip 96 is stamped from a semi-rigid, 250-micron-thick sheet of copper alloy or other metal. Lead frame strip 96 includes lead assemblies 87 and 90 and gate lead assemblies 88 and 91. Lead frame strip 96 also includes a connecting portion (not explicitly shown) that holds the aforementioned lead assemblies together and provides structural support for lead frame strip 96. The connecting portion of lead frame strip 96 may also connect the lead assemblies 87, 88, 90, 91 to source and gate lead assemblies for several other power MOSFET packages (not shown), which may be fabricated simultaneously with power MOSFET package 10.

Referring to FIG. 7A, an electrically conductive adhesive layer 89 is deposited on source contact area 84 and, separately, source contact area 86 and gate contact areas 85 and 87 of power MOSFET chip 82. Adhesive layer 89 may be, for example, a silver-filled epoxy or polyimide paste. Lead frame strip 96 is then pressed onto the top surface of chip 82, with the contact areas of lead assemblies 87, 88, 90 and 91 aligned with their respective source and gate contact areas. Adhesive layer 89 is then cured in a curing oven, if necessary.

Referring to FIG. 7B, chip 82 is placed in a mold and plastic encapsulant 94 is injection-molded around chip 82 and portions of lead frame strip 96. Referring to FIG. 7C, lead frame strip 96 is trimmed to remove the connecting portions of the lead frame strip, thereby separating lead assemblies 87, 88, 90 and 91 from each other and from the source and gate leads of any other power MOSFET packages connected by lead frame strip 96.

Source and gate leads 87b, 88b, 90b and 91b are also formed in a gull-wing shape for surface-mounting on a printed circuit board. The above-mentioned trim and form steps are preferably performed simultaneously by a single press which can accommodate the number of chips connected by lead frame strip 96.

After fabrication, power MOSFET package 80 may be mounted on a printed circuit board, with source and gate leads 87b, 88b, 90b and 91b aligned with corresponding contact areas on the printed circuit board. A standard solder reflow process may be used to provide rigid structural and electrical contact between power MOSFET package 80 and the printed circuit board.

Figure 8A:
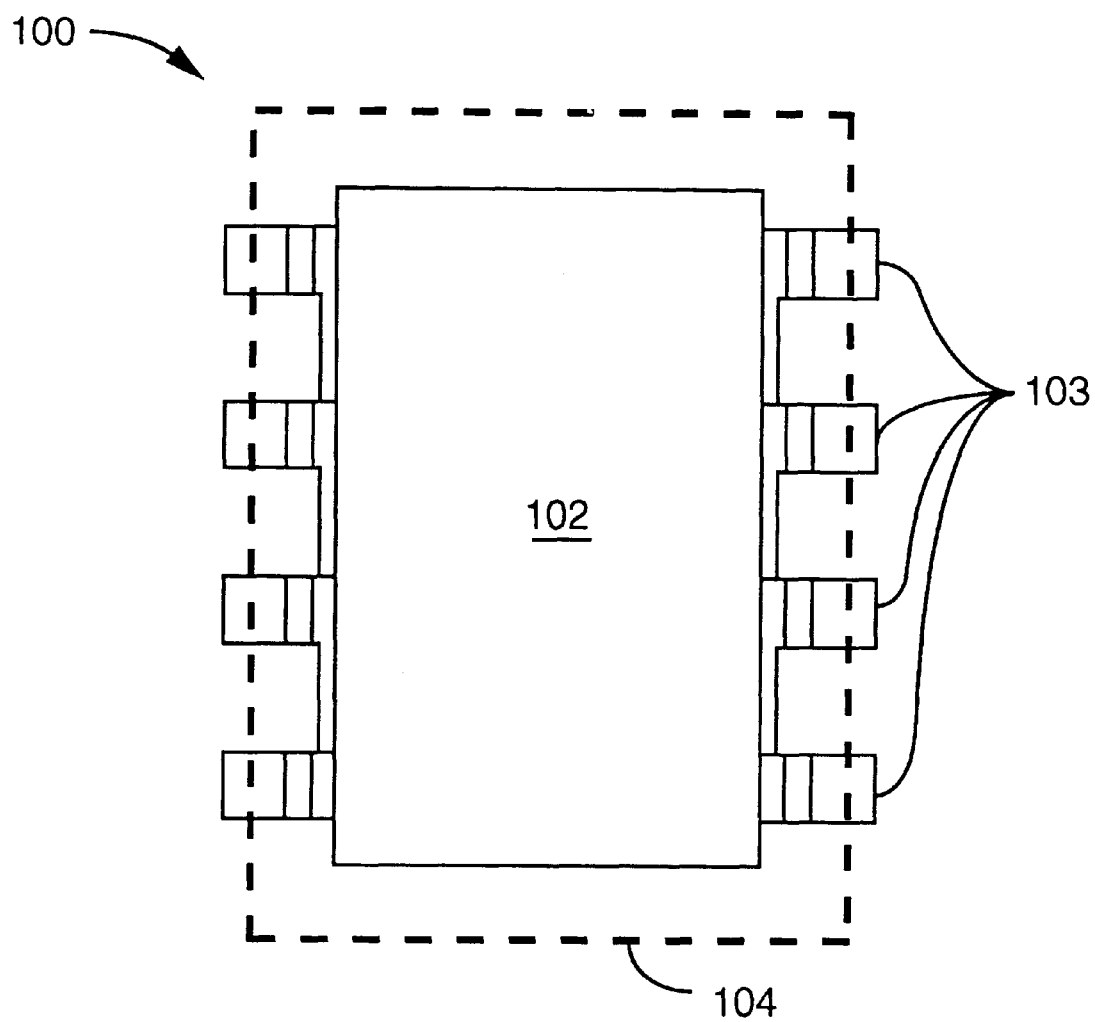
FIG. 8A is a top view of a fifth power MOSFET package constructed in accordance with one embodiment of the present invention.
Figure 8B:
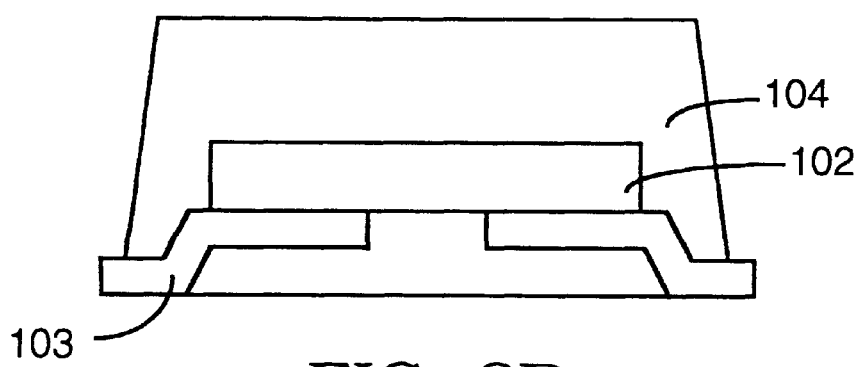
FIG. 8B is a cross section of the fifth power MOSFET package.

Referring to FIGS. 8A and 8B, a fifth power MOSFET package 100 constructed in accordance with the present invention is shown in top view and cross section, respectively. Power MOSFET package 100 is similar in design to power MOSFET package 80, and therefore will not be described in detail.

One difference between power MOSFET package 100 and power MOSFET package 80 is that the source and gate contact areas (not shown) are on the bottom side of power MOSFET chip 102. The source and gate lead assemblies 103 are therefore attached to the bottom side of chip 102.

Another difference between power MOSFET package 100 and power MOSFET package 80 is that encapsulant 104 of power MOSFET package 100 encloses a larger potion of source and gate lead assemblies 103, forming a leadless chip carrier type of package.

Yet another difference between power MOSFET package 100 and power MOSFET package 80 is that source and gate lead assemblies 103 are each separated in half. Each lead assembly therefore comprises two separate contact areas, with each contact area having one lead extending therefrom as shown in FIG. 8B. Both contact areas on a lead assembly 103 contact a single, continuous metallization layer that forms the source or gate contact area on the bottom side of chip 102. This latter characteristic of power MOSFET package 100 may also be implemented in a configuration such as power MOSFET package 80, in which the source and gate contact areas are on the top side of the power MOSFET chip 82.

The various embodiments described herein have several advantages over conventional leaded or leadless IC packages. First, the packages described herein have low electrical resistance contribution from the package, because the leads have lower resistance than conventional bondwires, and because the leads make contact across a large portion of the respective contact surfaces on the chip, effectively shorting out the contact surfaces.

Second, the packages described herein have good thermal transport from the top side of the chip to the printed circuit board, allowing cooling of the top side of the chip, where most of the heat is generated. The good thermal transport is enabled by the good thermal contact between the leads and the chip, and by the low thermal resistance of the leads.

Third, the packages described herein generally use lead frames with contact areas which are smaller than the chip itself. This is in contrast to conventional IC packages, in which the chip is bonded to a die pad which has a larger surface area than the chip. The smaller size of the lead frames described herein allows a smaller package size for a given chip size, thereby allowing more efficient utilization of the limited surface area available on a printed circuit board or other chip environment. Other advantages will be apparent to those skilled in the art of IC package fabrication and implementation.

Although the present invention and its advantages have been described in detail, it should be understood that various changes, substitutions, and alterations can be made therein without departing from the spirit and scope of the invention as defined by the appended claims.

We claim:

1. A semiconductor device comprising:
   a semiconductor die having a top and bottom surfaces, the semiconductor die having a plurality of contact areas on a selected one of the top and bottom surfaces;
   a first semi-rigid assembly having an assembly contact attached to a first one of the contact areas of the semiconductor die assembly being connected to the assembly contact;
   a second semi-rigid assembly having an assembly contact attached to a second one of the contact areas of the semiconductor die, the second lead assembly being connected to the assembly contact; and
   an encapsulant enclosing the semiconductor die, the lead assembly contact of the first lead assembly and the lead assembly contact of the second lead assembly wherein the first and second contact areas of the semiconductor die are formed on the bottom surface of the semiconductor die, and wherein the encapsulant encapsulates a portion of the first and second assemblies so as to form a leadless chip carrier package.

2. The semiconductor device of claim 1, further comprising an adhesive layer attaching the assembly contact of the first assembly to the first contact area of the semiconductor die.

3. A semiconductor package comprising:
   a semiconductor chip having top and bottom surfaces, the semiconductor chip having a plurality of contact areas on a selected one of the top and bottom surfaces;
   a first assembly formed from a semi-rigid sheet of conductive material, the first assembly having an assembly contact attached to a first one of the contact areas of the semiconductor chip, the first assembly being connected to and extending from the assembly contact;
   a second assembly formed from a semi-rigid sheet of conductive material, the second assembly having an assembly contact attached to a second one of the contact areas of the semiconductor chip, the second assembly being connected to and extending from the assembly contact; and
   an encapsulant enclosing the semiconductor chip, the assembly contact of the first assembly and the assembly contact of the second assembly,
   wherein the first and second contact areas of the semiconductor die are formed on the bottom surface of the semiconductor die, and wherein the encapsulant encapsulates a portion of the first and second assemblies so as to form a leadless chip carrier package.

4. The semiconductor device of claim 3, wherein the respective assembly contacts of the first and second assemblies each have a surface area smaller than a surface area of the semiconductor chip.

5. The semiconductor device of claim 3, further comprising an adhesive layer attaching the assembly contact of the first assembly to the first contact area of the semiconductor die.

6. A power MOSFET integrated circuit chip package comprising:
   a semiconductor die having top and bottom surfaces, the semiconductor die having a plurality of contact areas on a selected one of the top and bottom surfaces, the semiconductor die further having a plurality of power MOSFETs formed thereon for conducting current between the top and bottom surfaces;
   a first semi-rigid assembly having an assembly contact attached to a first one of the contact areas of the semiconductor die, the first assembly being connected to the assembly contact;
   a second semi-rigid assembly having an assembly contact attached to a second one of the contact areas of the semiconductor die, the second assembly being connected to the assembly contact; and
   an encapsulant enclosing the semiconductor die, the assembly contact of the first assembly and the assembly contact of the second assembly,
   wherein the first and second contact areas of the semiconductor die are formed on the bottom surface of the semiconductor die, and wherein the encapsulant encapsulates a portion of the first and second assemblies so as to form a leadless chip carrier package.

7. The power MOSFET integrated circuit chip package of claim 6, further comprising an adhesive layer attaching the assembly contact of the first assembly to the first contact area of the semiconductor die.

8. A MOSFET package comprising:
   a semiconductor die containing two groups of MOSFETs, a first group of said MOSFETs having a first main terminal and a first gate terminal on a first side of said die, a second group of said MOSFETs having a second main terminal and a second gate terminal on said first side of said die, said first and second main terminals being electrically isolated from each other, said two groups of MOSFETs sharing a third main terminal on a second side of said die;
   a plastic capsule enclosing said die;
   a first semi-rigid lead assembly, said first lead assembly being in contact with said first main terminal and having opposite leads that protrude from opposite sides of said capsule;

a second semi-rigid lead assembly, said second lead assembly being in contact with said second main terminal and having opposite leads that protrude from opposite sides of said capsule; and a third semi-rigid lead assembly, said third lead assembly being in contact with said first gate terminal and having opposite leads that protrude from opposite sides of said capsule.

9. The MOSFET package of claim 8 comprising a fourth semi-rigid lead assembly, said fourth lead assembly being in contact with said second gate terminal and having opposite leads that protrude from opposite sides of said capsule.

10. The MOSFET package of claim 8 wherein said first and second main terminals are source terminals and third terminal is a drain terminal.

11. The MOSFET package of claim 8 wherein said first side of said die is a top side and said second side of said die is a bottom side.

12. The MOSFET package of claim 11 wherein respective ends of said leads are substantially coplanar with a bottom of said capsule.

13. The MOSFET package of claim 8 wherein said leads are symmetrical about a central axis of said die.

* * * * *